(12) United States Patent
Hiratani et al.

(10) Patent No.: US 10,609,811 B2
(45) Date of Patent: Mar. 31, 2020

(54) CIRCUIT DEVICE

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

(72) Inventors: Shungo Hiratani, Mie (JP); Hideaki Tahara, Mie (JP); Yuuichi Hattori, Mie (JP); Akira Haraguchi, Mie (JP); Jun Ikeda, Mie (JP); Arinobu Nakamura, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/495,428

(22) PCT Filed: Mar. 19, 2018

(86) PCT No.: PCT/JP2018/010715
§ 371 (c)(1),
(2) Date: Sep. 19, 2019

(87) PCT Pub. No.: WO2018/180671
PCT Pub. Date: Oct. 4, 2018

(65) Prior Publication Data
US 2020/0077509 A1 Mar. 5, 2020

(30) Foreign Application Priority Data
Mar. 30, 2017 (JP) ................. 2017-068332

(51) Int. Cl.
*H05K 1/02* (2006.01)
*H05K 5/00* (2006.01)

(52) U.S. Cl.
CPC .......... *H05K 1/0209* (2013.01); *H05K 1/021* (2013.01); *H05K 5/006* (2013.01)

(58) Field of Classification Search
CPC .. H05K 1/0201; H05K 1/0203; H05K 1/0204; H05K 1/0206; H05K 1/0207; H05K 1/0209
See application file for complete search history.

(56) References Cited

U.S. PATENT DOCUMENTS

2003/0137813 A1  7/2003  Onizuka et al.
2010/0254093 A1  10/2010  Oota et al.
2018/0079377 A1  3/2018  Maeda et al.

FOREIGN PATENT DOCUMENTS

| JP | H6-252573 A | 9/1994 |
| JP | 2006-325352 A | 11/2006 |
| JP | 2012-069902 A | 4/2012 |

OTHER PUBLICATIONS

International Search Report, Application No. PCT/JP2018/010715, dated Jun. 12, 2018. ISA/Japan Patent Office.

*Primary Examiner* — Jeremy C Norris
(74) *Attorney, Agent, or Firm* — Honigman LLP

(57) ABSTRACT

A conductor is placed on a first placement portion of a heat dissipation member with an insulation member interposed therebetween. An FET is electrically connected to the conductor. When current flows between the drain and the source of the FET, the FET generates heat. A second placement portion of a circuit board is placed on the conductor. The conductor and the insulation member are sandwiched between the first placement portion and the second placement portion. In the heat dissipation member, a first extension portion extends from the first placement portion, and in the circuit board, a second extension portion extends from the second placement portion. The first extension portion is located opposite to and is spaced apart from the second extension portion, and a microcomputer is placed on an (Continued)

upper surface of the second extension portion. The microcomputer outputs a control signal for turning the FET ON or OFF.

11 Claims, 10 Drawing Sheets

CIRCUIT DEVICE

CROSS-REFERENCE TO RELATED APPLICATIONS

This application is the U.S. national stage of PCT/JP2018/010715 filed on Mar. 19, 2018, which claims priority of Japanese Patent Application No. JP 2017-068332 filed on Mar. 30, 2017, the contents of which are incorporated herein.

TECHNICAL FIELD

The present disclosure relates to a circuit device.

BACKGROUND

JP 2003-164039A discloses an electrical junction box that is connected to a battery and a load, such as a head lamp or a wiper. In this electrical junction box, a plurality of plate-shaped conductors are placed on a placement surface of a heat dissipation member with an insulation member interposed therebetween, and plate surfaces on one side of the conductors face the placement surface. One end and another end of a semiconductor switch are respectively connected to two of the plurality of conductors. The one end of the semiconductor switch is connected to the battery via one of the two conductors, and the other end of the semiconductor switch is connected to the load via the other of the two conductors.

A circuit board is arranged on plate surfaces on the other side of the plurality of conductors, and a plate surface of the circuit board faces the plate surfaces on the other side of the conductors. A control element is arranged on the other plate surface of the circuit board, and the control element outputs control signals for turning the semiconductor switch ON or OFF. If the control element outputs a control signal for turning the semiconductor switch ON, the semiconductor switch is switched ON and power is supplied from the battery to the load with current flowing via the semiconductor switch. If the control element outputs a control signal for turning the semiconductor switch OFF, the semiconductor switch is switched OFF and power supply from the battery to the load is stopped with the flow of current via the semiconductor switch being interrupted.

When current is flowing via the semiconductor switch, the semiconductor switch generates heat. The heat generated by the semiconductor switch is conducted by the conductors and the heat dissipation member in this order, and dissipates from the heat dissipation member.

In the electrical junction box described in JP 2003-164039A, the heat dissipation member, the conductors, the circuit board, and the control element are arranged in this order. Therefore, heat generated by the semiconductor switch is conducted via the conductors and the circuit board to the control element. Accordingly, if the temperature of the semiconductor switch increases, the temperature of the control element increases at a speed that is substantially the same as the speed at which the temperature of the semiconductor switch increases.

The control element has low heat resistance, and therefore the upper limit value of the temperature of the semiconductor switch up to which its normal operation is ensured is usually higher than the upper limit value of the temperature of the control element up to which its normal operation is ensured. In this case, operation of the semiconductor switch is controlled such that the temperature of the semiconductor switch does not become higher than or equal to the upper limit value of the temperature of the control element. For example, if the temperature of the semiconductor switch becomes close to the upper limit value of the temperature of the control element, the control element outputs a control signal to switch the semiconductor switch OFF and stop power supply via the semiconductor switch.

As described above, the electrical junction box described in JP 2003-164039A has a problem in that the upper limit value of an allowable temperature of the semiconductor switch is lower than the actual upper limit value of the temperature of the semiconductor switch.

Circuit devices in which such a problem occurs are not limited to the electrical junction box described in JP 2003-164039A. Similar problems occur in circuit devices in which a heat dissipation member, a conductor, a circuit board, and a control element are arranged in this order and a circuit component that generates heat is connected to the conductor.

In such a circuit device, the control element outputs control signals for controlling operation of the circuit component, and the upper limit value of the temperature of the circuit component up to which its normal operation is ensured is higher than the upper limit value of the temperature of the control element up to which its normal operation is ensured. Therefore, the upper limit value of an allowable temperature of the circuit component is lower than the actual upper limit value of the temperature of the circuit component.

SUMMARY

The present disclosure aims to provide a circuit device in which the upper limit value of an allowable temperature of a circuit component is high.

A circuit device according to one aspect of the present disclosure includes a heat dissipation member, a conductor that is placed on the heat dissipation member with an insulation member interposed therebetween, a circuit component that is electrically connected to the conductor and generates heat, a circuit board that is placed on the conductor, and a control element that is placed on the circuit board and outputs a control signal for controlling operation of the circuit component, wherein the heat dissipation member includes a first placement portion on which the conductor is placed and a first extension portion that extends from the first placement portion, the circuit board includes a second placement portion that is placed on the conductor and is arranged such that the conductor and the insulation member are sandwiched between the first placement portion and the second placement portion, and a second extension portion that extends from the second placement portion, is located opposite to and is spaced apart from the first extension portion, and the control element is placed on the second extension portion.

Advantageous Effects of Disclosure

According to the present disclosure, the upper limit value of an allowable temperature of a circuit component is high.

DETAILED DESCRIPTION OF PREFERRED EMBODIMENTS

Figure 1:
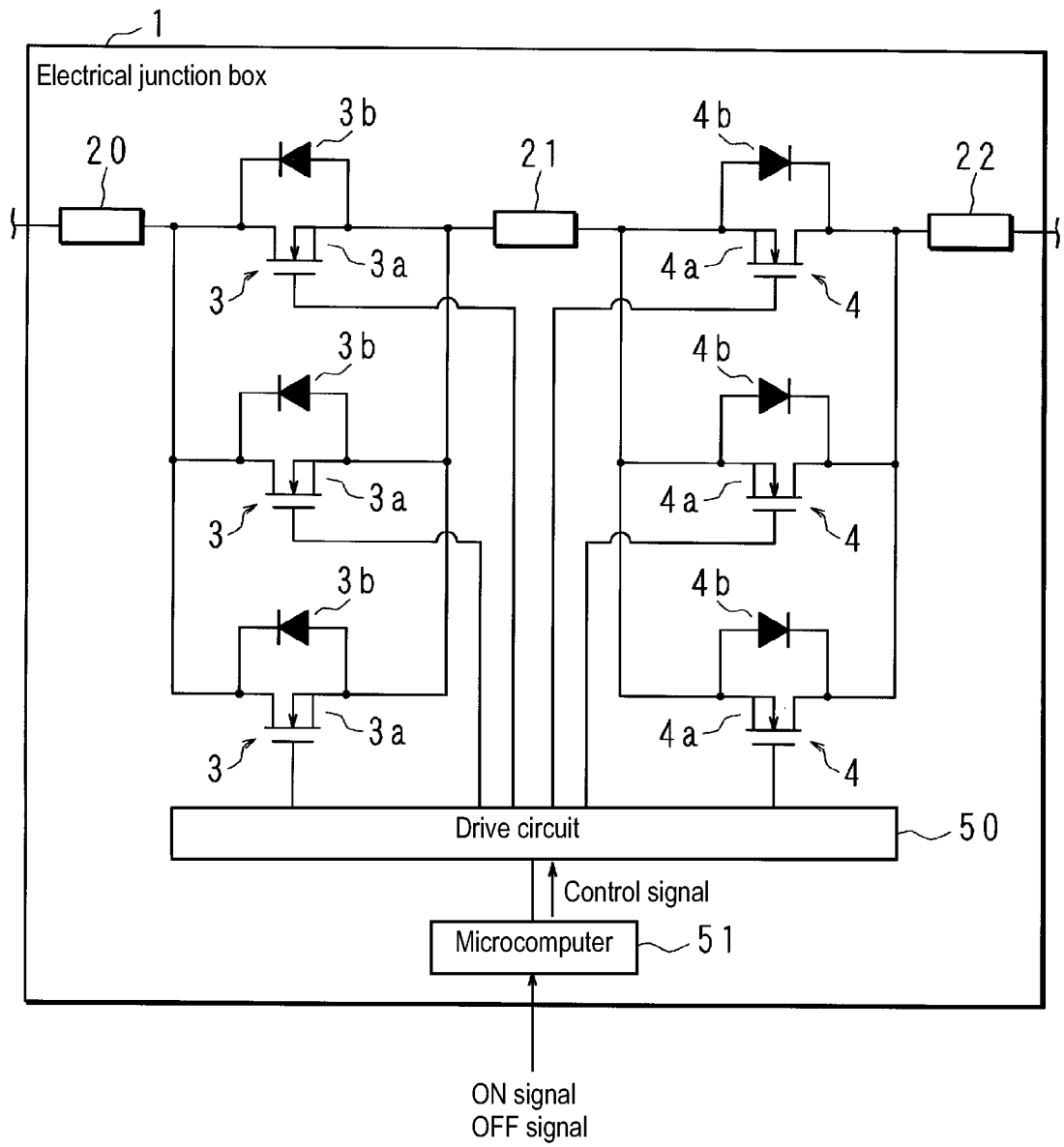
FIG. 1 is a circuit diagram of an electrical junction box in a first embodiment.

First, aspects of implementation of the present disclosure will be listed and described. At least some of embodiments described below may also be combined as desired.

A circuit device according to one aspect of the present disclosure includes a heat dissipation member, a conductor that is placed on the heat dissipation member with an insulation member interposed therebetween, a circuit component that is electrically connected to the conductor and generates heat, a circuit board that is placed on the conductor, and a control element that is placed on the circuit board and outputs a control signal for controlling operation of the circuit component, wherein the heat dissipation member includes a first placement portion on which the conductor is placed and a first extension portion that extends from the first placement portion, the circuit board includes a second placement portion that is placed on the conductor and is arranged such that the conductor and the insulation member are sandwiched between the first placement portion and the second placement portion, and a second extension portion that extends from the second placement portion, is located opposite to and is spaced apart from the first extension portion, and the control element is placed on the second extension portion.

According to the above-described aspect, the conductor and the insulation member are sandwiched between the first placement portion of the heat dissipation member and the second placement portion of the circuit board, and there is no air layer between the first placement portion and the second placement portion. On the other hand, the first extension portion of the heat dissipation member is located opposite to and is spaced apart from the second extension portion of the circuit board, and there is an air layer between the first extension portion and the second extension portion. The control element is placed on the second extension portion of the circuit board so as to be located opposite to the air layer with the circuit board interposed therebetween, for example. In this case, heat generated by the circuit component is hardly conducted to the control element via the conductor or the heat dissipation member. Accordingly, even if the temperature of the circuit component increases, the temperature of the control element hardly increases. As a result, the upper limit value of an allowable temperature of the circuit component is high, because this value is not limited by the upper limit value of the temperature of the control element up to which its normal operation is ensured.

Furthermore, the heat dissipation member includes the first extension portion, and therefore heat generated by the circuit component efficiently dissipates.

In a circuit device according to another aspect of the present disclosure, a distance between the first extension portion and the second extension portion is longer than a distance between the first placement portion and the second placement portion.

According to this aspect, the distance between the first extension portion of the heat dissipation member and the second extension portion of the circuit board is long, and therefore the air layer is thick and the heat insulation effect of the air layer is high.

A circuit device according to another aspect of the present disclosure further includes a reinforcement member that is arranged between the first extension portion and the second extension portion, is bonded to the second extension portion, and reinforces the circuit board.

According to this aspect, the second extension portion of the circuit board is reinforced by the reinforcement member.

A circuit device according to another aspect of the present disclosure further includes a frame member that is arranged along a circumferential edge of the circuit board, surrounds the circuit board, and supports the reinforcement member.

According to this aspect, the frame member surrounding the circuit board is provided, and the reinforcement member is supported by the frame member. Therefore, the second extension portion of the circuit board has a higher strength.

A circuit device according to another aspect of the present disclosure further includes a frame member that is arranged along a circumferential edge of the circuit board and surrounds the circuit board, and a lid member that is located opposite to the circuit board and covers the inside of the frame member, wherein the conductor, the circuit component, the circuit board, and the control element are arranged between the heat dissipation member and the lid member.

According to this aspect, the circuit component is covered by the frame member and the lid member, and therefore air that is in contact with the circuit component is unlikely to be discharged to the outside of the circuit device. Therefore, most of heat generated by the circuit component is conducted by the conductor and the heat dissipation member. The air layer functions more effectively in a configuration in which the frame member and the lid member are provided.

In a circuit device according to another aspect of the present disclosure, the circuit device includes a plurality of the conductors, the circuit component is a semiconductor switch that is electrically connected to two of the plurality of conductors, and the control signal is a signal for turning the circuit component ON or OFF.

According to this aspect, current flows via the two conductors and the semiconductor switch that functions as the circuit component. If the semiconductor switch is switched ON, current is allowed to flow via the two conductors, and if the semiconductor switch is switched OFF, current does not flow via the two conductors.

The following describes specific examples of electrical junction boxes (circuit devices) according to embodiments of the present disclosure with reference to the accompanying drawings. Note that the present disclosure is not limited to these examples, but is defined by the claims, and is intended to encompass all modifications within the meanings and scope that are equivalent to the claims.

First Embodiment

FIG. 1 is a circuit diagram of an electrical junction box 1 in a first embodiment. The electrical junction box 1 is favorably mounted in a vehicle and includes conductors 20, 21, and 22, six N-channel field effect transistors (FETs) 3 and 4, a drive circuit 50, and a microcomputer 51. Each of the conductors 20, 21, and 22 is a so-called bus bar and is made of a copper alloy, for example. The electrical junction box 1 functions as a circuit device.

Each of the FETs 3 includes an FET main body 3*a* and a diode 3*b*, and the diode 3*b* is connected between the drain and the source of the FET main body 3*a*. Each of the FETs 4 includes an FET main body 4*a* and a diode 4*b*, and the diode 4*b* is connected between the drain and the source of the FET main body 4*a*. The diodes 3*b* and 4*b* are parasitic diodes.

The three FET main bodies 3*a* are connected in parallel between the conductors 20 and 21, and the three FET main bodies 4*a* are connected in parallel between the conductors 21 and 22. The drains of the three FET main bodies 3*a* are connected to the conductor 20, the sources of the six FET main bodies 3*a* and 4*a* are connected to the conductor 21, and the drains of the three FET main bodies 4*a* are connected to the conductor 22. The gates of the six FET main bodies 3*a* and 4*a* are connected to the drive circuit 50. Further, the microcomputer 51 is connected to the drive circuit 50.

Each of the FETs 3 and 4 functions as a semiconductor switch. The drive circuit 50 adjusts the voltages at the gates of the six FETs 3 and 4 relative to a fixed potential. Thus, the drive circuit 50 switches the six FETs 3 and 4 ON or OFF.

If the six FETs 3 and 4 are switched ON, current is allowed to flow via the conductors 20, 21, and 22 and the six FETs 3 and 4. If the six FETs 3 and 4 are switched OFF, current does not flow via the conductors 20, 21, and 22 and the six FETs 3 and 4.

When current flows between the drains and the sources of the FETs 3, the FETs 3 generate heat. Similarly, when current flows between the drains and the sources of the FETs 4, the FETs 4 generate heat. Each of the FETs 3 and 4 also functions as a circuit component.

The anodes of the three diodes 3*b* are connected to the anodes of the three diodes 4*b* via the conductor 21. Therefore, when the six FETs 3 and 4 are switched OFF, current does not flow via the six diodes 3*b* and 4*b*.

An ON signal that turns the six FETs 3 and 4 ON and an OFF signal that turns the six FETs 3 and 4 OFF are input to the microcomputer 51. The microcomputer 51 outputs a control signal that turns the six FETs 3 and 4 ON or OFF to the drive circuit 50 depending on the signal that is input.

Specifically, if an ON signal is input, the microcomputer 51 outputs a control signal for turning the six FETs 3 and 4 ON to the drive circuit 50, and the drive circuit 50 switches the six FETs 3 and 4 ON. If an OFF signal is input, the microcomputer 51 outputs a control signal for turning the six FETs 3 and 4 OFF to the drive circuit 50, and the drive circuit 50 switches the six FETs 3 and 4 OFF.

The control signals are signals for controlling operation of each of the six FETs 3 and 4.

Figure 2:
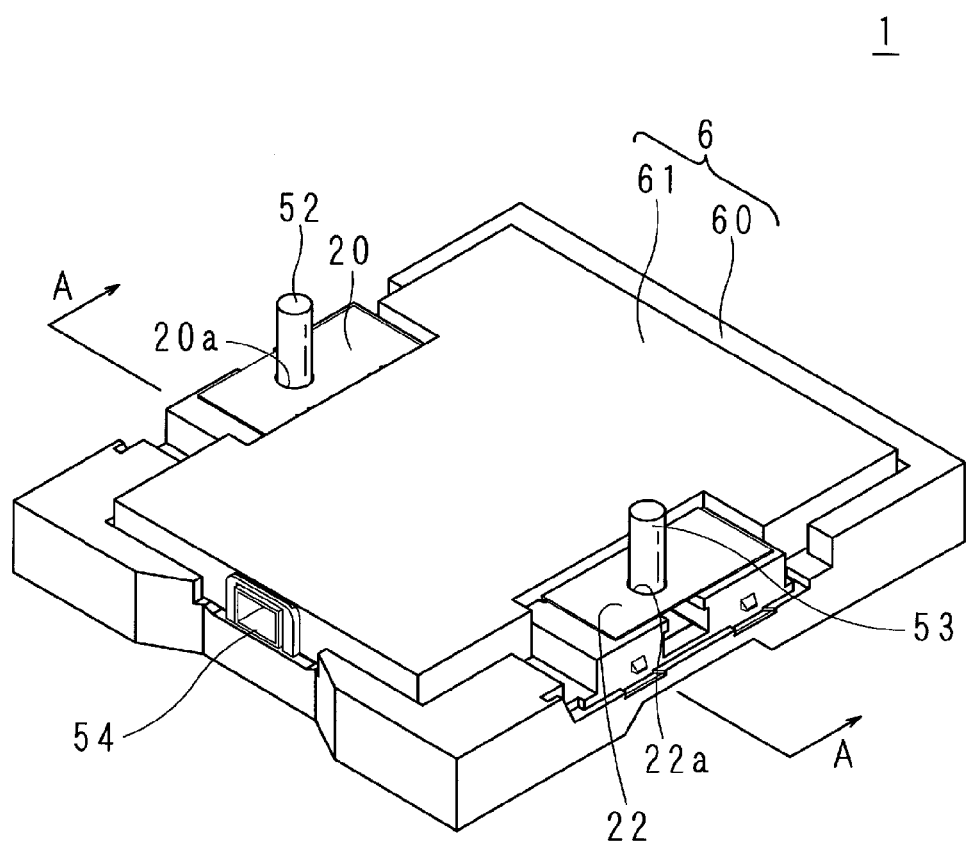
FIG. 2 is a perspective view of the electrical junction box.

FIG. 2 is a perspective view of the electrical junction box 1. The electrical junction box 1 further includes a box-shaped housing member 6, and the six FETs 3 and 4, the drive circuit 50, and the microcomputer 51 are housed in the housing member 6. The housing member 6 includes a rectangular frame member 60 and a lid member 61. The lid member 61 is arranged on the upper side of the electrical junction box 1, is fitted inside the frame member 60, and covers the inside of the frame member 60.

The conductors 20 and 22 are plate-shaped. A plate surface of the conductor 20 covers the upper side of one side portion of the frame member 60, and a plate surface of the conductor 22 covers the upper side of another side portion of the frame member 60. The one side portion of the frame member 60 covered by the conductor 20 and the other side portion of the frame member 60 covered by the conductor 22 are arranged next to each other in the left-right direction and extend in the front-rear direction. Accordingly, the one side portion of the frame member 60 covered by the conductor 20 is located opposite to the other side portion of the frame member 60 covered by the conductor 22. In the following description, the one side portion of the frame member 60 covered by the conductor 20 will be referred to as a left side portion and the other side portion of the frame member 60 covered by the conductor 22 will be referred to as a right side portion.

A cylindrical stud bolt 52 protrudes upward from an upper surface of the left side portion of the frame member 60. The conductor 20 has a through hole 20*a* that passes therethrough in the up-down direction, and the stud bolt 52 passes through the through hole 20*a*. Similarly, a cylindrical stud bolt 53 protrudes upward from an upper surface of the right side portion of the frame member 60. The conductor 22 has a through hole 22*a* that passes therethrough in the up-down direction, and the stud bolt 53 passes through the through hole 22*a*. The two stud bolts 52 and 53 are located opposite to each other in the left-right direction, and a thread is formed in each of the stud bolts 52 and 53.

A non-illustrated terminal that has an opening is attached to the stud bolt 52. Specifically, in a state where the stud bolt 52 passes through the opening of the terminal, a non-illustrated nut is tightened to the stud bolt 52. As a result, the conductor 20 and the terminal come into contact with each other and the conductor 20 is electrically connected to the terminal.

Similarly, a non-illustrated terminal that has an opening is attached to the stud bolt 53. Specifically, in a state where the stud bolt 53 passes through the opening of the terminal, a non-illustrated nut is tightened to the stud bolt 53. As a result, the conductor 22 and the terminal come into contact with each other and the conductor 22 is electrically connected to the terminal.

The terminal attached to the stud bolt 52 is connected to a positive electrode of the battery, for example, and the terminal attached to the stud bolt 53 is connected to one end of the load, for example. Power is supplied from the battery to the load via the electrical junction box 1.

The electrical junction box 1 has a connector 54, and a non-illustrated connector that is provided at an end portion of a non-illustrated signal line is fitted into the connector 54. The ON signal and the OFF signal are input to the microcomputer 51 of the electrical junction box 1 via the signal line.

Figure 3:
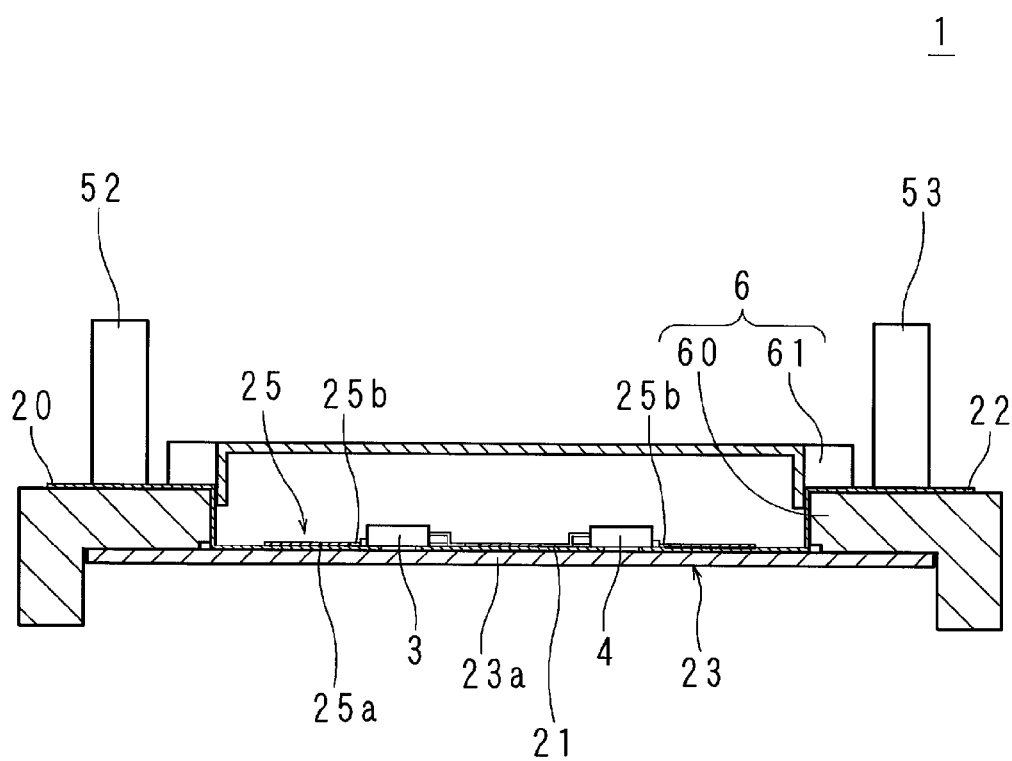
FIG. 3 is a cross-sectional view taken along line A-A in FIG. 2.

FIG. 3 is a cross-sectional view taken along line A-A in FIG. 2. A plate-shaped heat dissipation member 23 is housed in the frame member 60. The heat dissipation member 23 is made of aluminum, for example. The heat dissipation member 23 includes a first placement portion 23*a*, and the conductors 20, 21, and 22 are placed on the first placement portion 23*a*. The frame member 60 covers a left edge portion and a right edge portion of an upper surface of the first placement portion 23*a* of the heat dissipation member 23. The conductor 20 is bent a plurality of times, and the plate surface of the conductor 20 covers not only the upper surface of the left side portion of the frame member 60 but also a left side portion of the upper surface of the first placement portion 23*a* of the heat dissipation member 23 inside the frame member 60 and an inner surface of the left side portion of the frame member 60. Similarly, the conductor 22 is bent a plurality of times, and the plate surface of the conductor 22 covers not only the upper surface of the right side portion of the frame member 60 but also a right side portion of the upper surface of the first placement portion 23a of the heat dissipation member 23 inside the frame member 60 and an inner surface of the right side portion of the frame member 60.

The conductor 21 is also plate-shaped. The conductor 21 is placed between the conductors 20 and 22, on the upper surface of the first placement portion 23a of the heat dissipation member 23. The upper surface of the first placement portion 23a of the heat dissipation member 23 faces lower surfaces of the conductors 20, 21, and 22, and the upper surface of the first placement portion 23a of the heat dissipation member 23 is bonded to the lower surfaces of the conductors 20, 21, and 22 using an insulation member 24 (see FIG. 7) that serves as an adhesive.

As described above, the conductors 20, 21, and 22 are placed on the upper surface of the first placement portion 23a of the heat dissipation member 23 with the insulation member 24 interposed therebetween. In addition to the first placement portion 23a, the heat dissipation member 23 also includes a first extension portion 23b that extends from the first placement portion 23a (see FIGS. 6 and 7).

Inside the frame member 60, the FETs 3 and 4, which are chip-shaped, are arranged on the upper side of the conductors 20, 21, and 22. As described above, the drains of the FETs 3 are electrically connected to the conductor 20, the sources of the FETs 3 and 4 are electrically connected to the conductor 21, and the drains of the FETs 4 are electrically connected to the conductor 22. Inside the frame member 60, a circuit board 25 is arranged on upper surfaces of the conductors 20, 21, and 22. Specifically, the circuit board 25 includes a second placement portion 25a that is placed on the upper surfaces of the conductors 20, 21, and 22, and a lower surface of the second placement portion 25a faces the upper surfaces of the conductors 20, 21, and 22. Six openings 25b are provided in the second placement portion 25a of the circuit board 25 (see FIG. 4). The six FETs 3 and 4 respectively pass through the six openings 25b.

Heat generated by the FETs 3 is conducted by the conductor 20, the insulation member 24, and the heat dissipation member 23 in this order, and is conducted by the conductor 21, the insulation member 24, and the heat dissipation member 23 in this order. Heat generated by the FETs 4 is conducted by the conductor 21, the insulation member 24, and the heat dissipation member 23 in this order, and is conducted by the conductor 22, the insulation member 24, and the heat dissipation member 23 in this order. Heat conducted to the heat dissipation member 23 dissipates from the heat dissipation member 23 to the outside of the electrical junction box 1.

Figure 4:
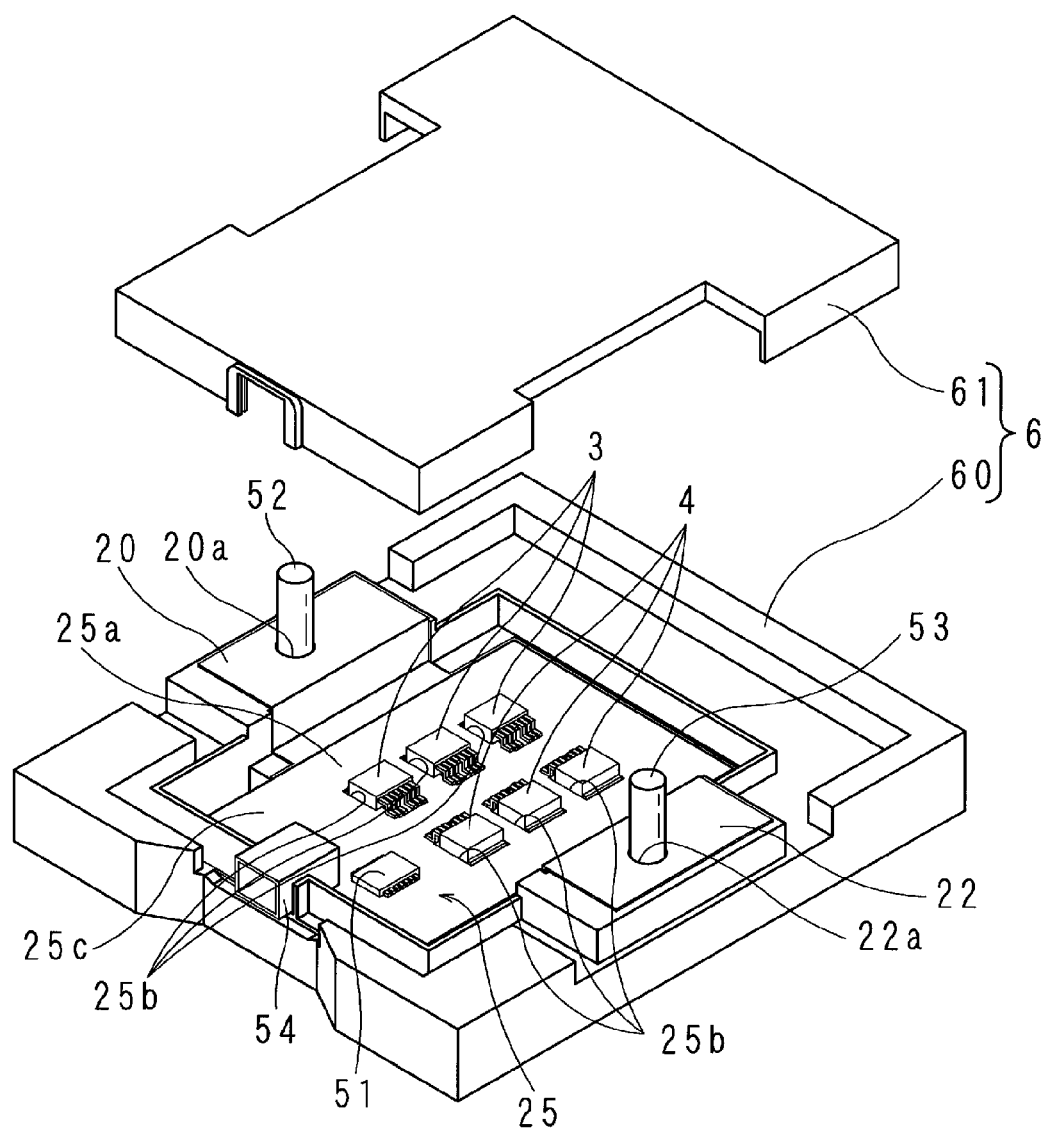
FIG. 4 is a perspective view of the electrical junction box from which a lid member is removed.
Figure 5:
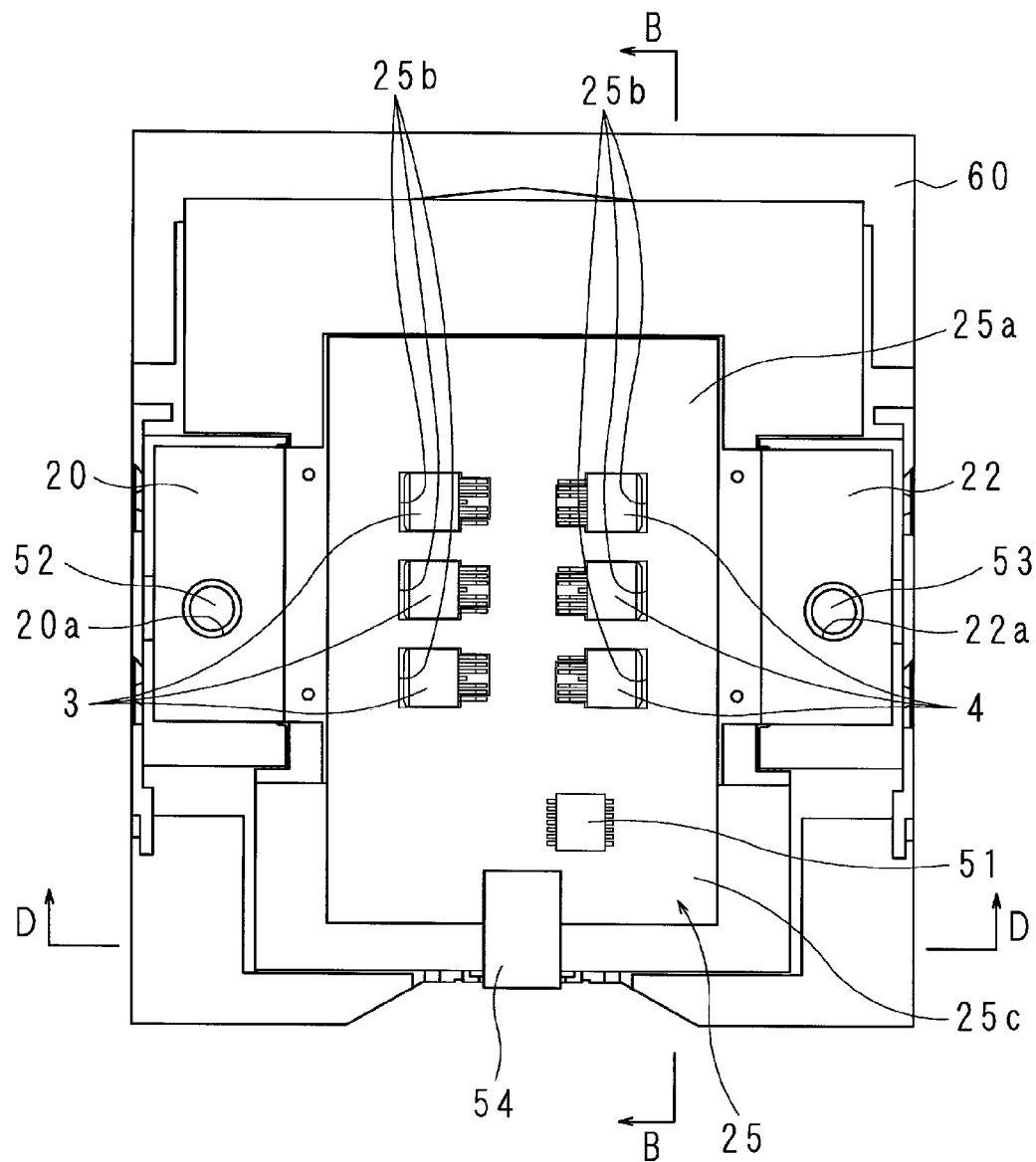
FIG. 5 is a plan view of the electrical junction box from which the lid member is removed.

FIG. 4 is a perspective view of the electrical junction box 1 from which the lid member 61 is removed, and FIG. 5 is a plan view of the electrical junction box 1 from which the lid member 61 is removed. The circuit board 25 has a rectangular shape and extends in the front-rear direction. The second placement portion 25a is provided in a rear side portion of the circuit board 25. The circuit board 25 further includes a second extension portion 25c that extends forward from the second placement portion 25a. The frame member 60 is arranged along the circumferential edge of the circuit board 25 and surrounds the circuit board 25.

The six openings 25b are provided in a lattice pattern in the second placement portion 25a of the circuit board 25. Three openings 25b are arranged in the front-rear direction and two openings 25b are arranged in the left-right direction.

The three FETs 3 are respectively arranged in three openings 25b that are provided in a left side portion of the second placement portion 25a of the circuit board 25. The three FETs 4 are respectively arranged in three openings 25b that are provided in a right side portion of the second placement portion 25a of the circuit board 25. The gates of the six FETs 3 and 4 are electrically connected to a non-illustrated conductive pattern that is provided on an upper surface of the circuit board 25.

The microcomputer 51 is chip-shaped and is placed on an upper surface of the second extension portion 25c of the circuit board 25. Also, the connector 54 is provided in a front side portion of the upper surface of the second extension portion 25c of the circuit board 25. The drive circuit 50 is formed on the upper surface of the circuit board 25. The microcomputer 51 functions as a control element. It should be noted that the drive circuit 50 is not illustrated in FIGS. 4 and 5.

The microcomputer 51 is electrically connected individually to the drive circuit 50 and the connector 54 by the conductive pattern provided on the upper surface of the circuit board 25. The drive circuit 50 is electrically connected to the gates of the six FETs 3 and 4 by the conductive pattern provided on the upper surface of the circuit board 25.

As described above, the connector of the signal line is fitted into the connector 54. The ON signal and the OFF signal are input via the signal line and the conductive pattern to the microcomputer 51. Also, control signals are input from the microcomputer 51 via the conductive pattern to the drive circuit 50. Further, the drive circuit 50 applies a voltage to the gates of the six FETs 3 and 4 via the conductive pattern and adjusts the voltages at these gates relative to a fixed potential.

As described above, if an ON signal is input, the microcomputer 51 outputs a control signal for turning the six FETs 3 and 4 ON to the drive circuit 50, and the drive circuit 50 switches the six FETs 3 and 4 ON. If an OFF signal is input, the microcomputer 51 outputs a control signal for turning the six FETs 3 and 4 OFF to the drive circuit 50, and the drive circuit 50 switches the six FETs 3 and 4 OFF.

As shown in FIGS. 3 and 4, the lid member 61 is located opposite to the upper surface of the circuit board 25 and covers the six FETs 3 and 4, the circuit board 25, and the microcomputer 51. The six FETs 3 and 4, the three conductors 20, 21, and 22, the circuit board 25, and the microcomputer 51 are arranged between the heat dissipation member 23 and the lid member 61.

Figure 6:
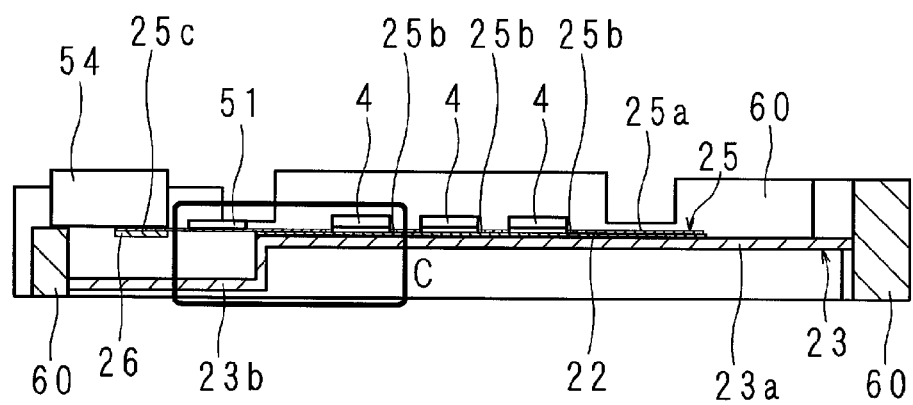
FIG. 6 is a cross-sectional view taken along line B-B in FIG. 5.

FIG. 6 is a cross-sectional view taken along line B-B in FIG. 5. The first placement portion 23a of the heat dissipation member 23 has an L-shape in cross section. The first placement portion 23a of the heat dissipation member 23 includes a rectangular flat plate that extends in the front-rear direction and a rectangular projecting plate that projects downward from a front edge portion of the flat plate. An upper surface of the flat plate of the first placement portion 23a faces the lower surface of the second placement portion 25a of the circuit board 25. The first extension portion 23b of the heat dissipation member 23 has the shape of a rectangular plate and extends forward from a lower edge portion of the projecting plate of the first placement portion 23a, and a leading end face of the first extension portion 23b abuts against an inner surface of a front side portion of the frame member 60.

The heat dissipation member 23 is obtained by bending a metal plate made of aluminum, for example.

As described above, in the circuit board 25, the second extension portion 25c extends forward from the second placement portion 25a. A lower surface of the second extension portion 25c of the circuit board 25 is located opposite to and is spaced apart from an upper surface of the first extension portion 23b of the heat dissipation member 23, and there is an air layer between the first extension portion 23b of the heat dissipation member 23 and the second extension portion 25c of the circuit board 25. Regarding the heat dissipation member 23 and the circuit board 25, the distance between the upper surface of the first extension portion 23b and the lower surface of the second extension portion 25c is longer than the distance between the upper surface of the first placement portion 23a and the lower surface of the flat plate of the second placement portion 25a. Accordingly, the distance between the first extension portion 23b and the second extension portion 25c is long, and the air layer between the first extension portion 23b and the second extension portion 25c is thick.

As described above, the microcomputer 51 is arranged on the upper surface of the second extension portion 25c of the circuit board 25. The connector 54 is supported by the second extension portion 25c of the circuit board 25 and the frame member 60.

Figure 7:
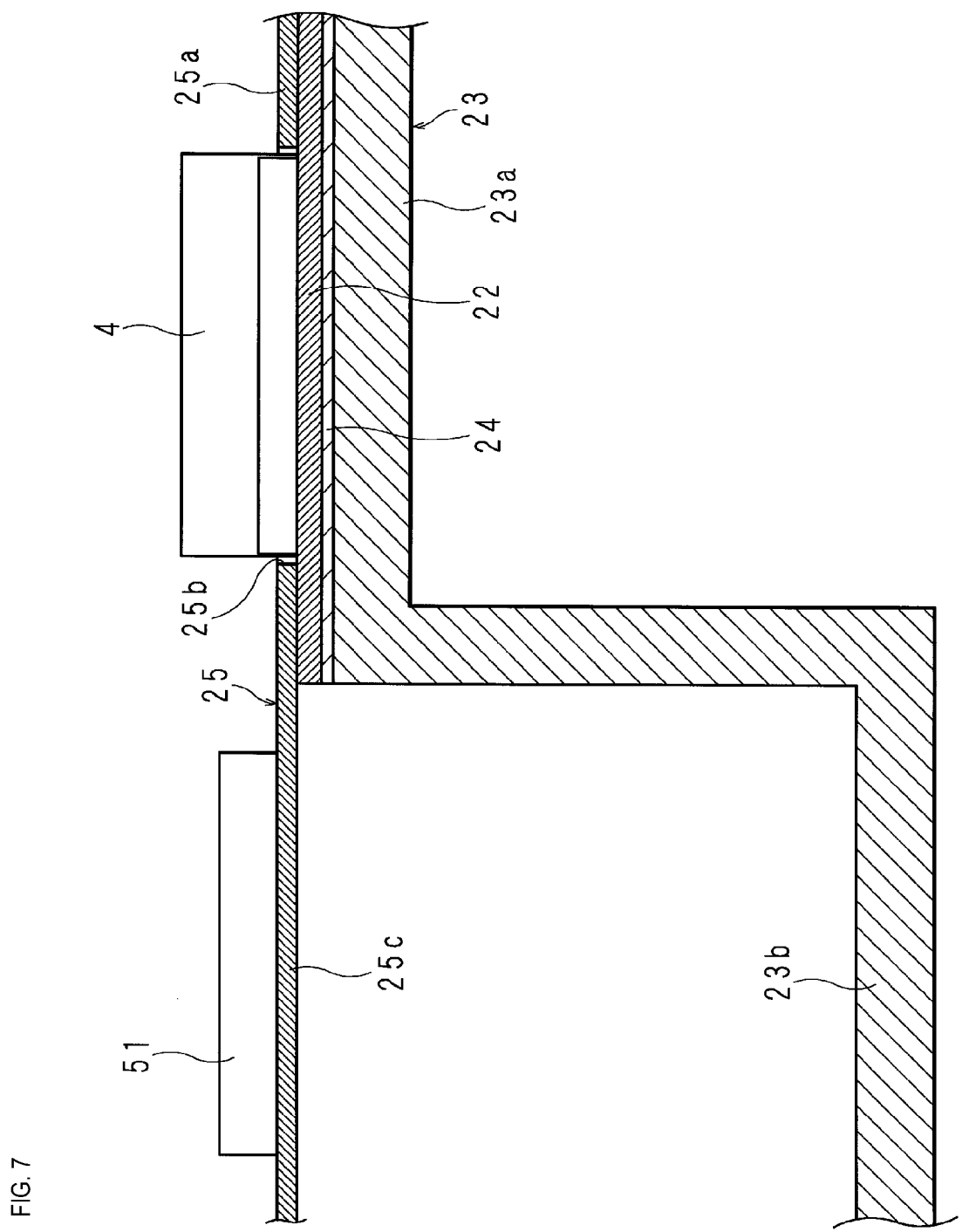
FIG. 7 is an enlarged view of a portion indicated by C in FIG. 6.

FIG. 7 is an enlarged view of a portion indicated by C in FIG. 6. As described above, the lower surfaces of the conductors 20, 21, and 22 are bonded to the upper surface of the flat plate of the first placement portion 23a of the heat dissipation member 23 using the insulation member 24 that serves as an adhesive, and the insulation member 24 has the shape of a layer. Specifically, the insulation member 24 is applied onto the upper surface of the flat plate of the first placement portion 23a of the heat dissipation member 23, and the conductors 20, 21, and 22 are arranged on the upper side of the insulation member 24. In this state, the insulation member 24 is heated. As a result, the insulation member 24 is cured and each of the conductors 20, 21, and 22 is bonded to the upper surface of the heat dissipation member 23 via the insulation member 24. The conductor 20 and the insulation member 24 are sandwiched between the first placement portion 23a of the heat dissipation member 23 and the second placement portion 25a of the circuit board 25. The conductor 21 and the insulation member 24 are also sandwiched between the first placement portion 23a and the second placement portion 25a, and the conductor 22 and the insulation member 24 are also sandwiched between the first placement portion 23a and the second placement portion 25a.

Current does not flow through the insulation member 24, and accordingly current does not flow from the conductors 20, 21, and 22 to the heat dissipation member 23. The insulation member 24 has heat dissipation properties. Therefore, heat is conducted from each of the conductors 20, 21, and 22 via the insulation member 24 to the heat dissipation member 23. The insulation member 24 is made of an epoxy resin that contains a heat-conductive filler, for example. For example, aluminum oxide is used as the heat-conductive filler.

Figure 8:
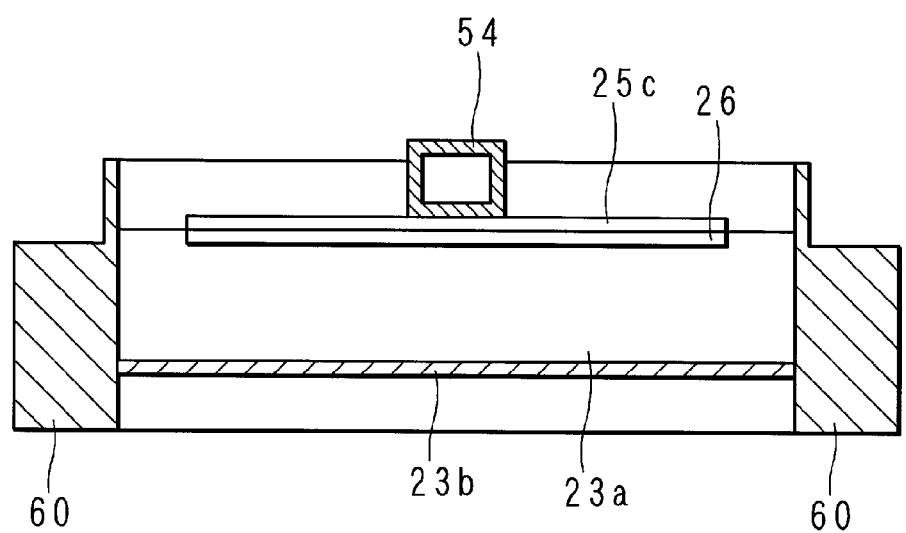
FIG. 8 is a cross-sectional view taken along line D-D in FIG. 5.

FIG. 8 is a cross-sectional view taken along line D-D in FIG. 5. FIG. 8 schematically shows a cross section taken along line D-D. The electrical junction box 1 further includes a reinforcement member 26 that has the shape of a rectangular plate. The reinforcement member 26 is arranged between the first extension portion 23b of the heat dissipation member 23 and the second extension portion 25c of the circuit board 25, and an upper surface of the reinforcement member 26 is bonded to a lower surface of a front edge portion of the second extension portion 25c of the circuit board 25 as shown in FIGS. 6 and 8. Therefore, the second extension portion 25c of the circuit board 25 is reinforced by the reinforcement member 26. As shown in FIG. 6, the microcomputer 51 is located opposite to the air layer with the second extension portion 25c of the circuit board 25 interposed therebetween, and the connector 54 is located opposite to the air layer with the second extension portion 25c of the circuit board 25 and the reinforcement member 26 interposed therebetween. The reinforcement member 26 is spaced apart from the conductors 20, 21, and 22 and the heat dissipation member 23, and is not in contact with the conductors 20, 21, and 22 and the heat dissipation member 23. The reinforcement member 26 is not electrically connected to the conductors 20, 21, and 22 and the heat dissipation member 23.

In the electrical junction box 1 configured as described above, the conductors and the insulation member are sandwiched between the first placement portion 23a of the heat dissipation member 23 and the second placement portion of the circuit board, and there is no air layer between the first placement portion 23a and the second placement portion 25a. On the other hand, the first extension portion 23b of the heat dissipation member 23 is located opposite to and is spaced apart from the second extension portion 25c of the circuit board 25, and there is the air layer between the first extension portion 23b and the second extension portion 25c. The microcomputer 51 is placed on the upper surface of the second extension portion 25c of the circuit board 25, and is located opposite to the air layer with the second extension portion 25c of the circuit board 25 interposed therebetween. Therefore, heat generated by the six FETs 3 and 4 is hardly conducted to the microcomputer 51 via one of the conductors 20, 21, and 22 or the heat dissipation member 23. As a result, even if the temperatures of the six FETs 3 and 4 increase, the temperature of the microcomputer 51 hardly increases.

The microcomputer 51 has low heat resistance, and therefore the upper limit values of the temperatures of the FETs 3 and 4 up to which their normal operation is ensured are higher than the upper limit value of the temperature of the microcomputer 51 up to which its normal operation is ensured. However, even if the temperatures of the six FETs 3 and 4 increase, the temperature of the microcomputer 51 hardly increases, and accordingly the upper limit values of allowable temperatures of the FETs 3 and 4 are high, because these values are not limited by the upper limit value of the temperature of the microcomputer 51 up to which its normal operation is ensured.

Furthermore, the heat dissipation member 23 includes the first extension portion 23b, and therefore the surface area of a portion of the heat dissipation member 23 that is in contact with external air is large. Therefore, heat generated by the six FETs 3 and 4 efficiently dissipates to the outside.

There may be a case where the electrical junction box 1 includes, other than the microcomputer 51, a low-temperature element whose upper limit value of the temperature up to which its normal operation is ensured, that is, whose upper limit value of a proper temperature is lower than the upper limit values of proper temperatures of the FETs 3 and 4. Examples of such a low-temperature element include a control integrated circuit (IC), an aluminum electrolytic capacitor, and the like. If a low-temperature element other than the microcomputer 51 is included, for example, if a low-temperature element is included in the drive circuit 50, it is preferable that the low-temperature element other than the microcomputer 51 is also placed on the upper surface of the second extension portion 25c of the circuit board 25.

The distance between the first extension portion 23b of the heat dissipation member 23 and the second extension portion 25c of the circuit board 25 is longer than the distance between the flat plate of the first placement portion 23a of the heat dissipation member 23 and the second placement portion 25a of the circuit board 25, and accordingly the distance between the first extension portion 23b and the second extension portion 25c is long. Therefore, the air layer between the first extension portion 23b and the second extension portion 25c is thick and the heat insulation effect of the air layer is high.

Furthermore, the six FETs 3 and 4 are covered by the frame member 60 and the lid member 61. Therefore, air that is in contact with the six FETs 3 and 4 is unlikely to be discharged to the outside of the electrical junction box 1. Accordingly, most of heat generated by the six FETs 3 and 4 is conducted by one of the conductors 20, 21, and 22, and the heat dissipation member 23. Therefore, the air layer functions more effectively in a configuration in which the frame member 60 and the lid member 61 are provided.

It should be noted that the six FETs 3 and 4, the circuit board 25, the drive circuit 50, and the microcomputer 51 are liquid-tightly sealed by the heat dissipation member 23, the frame member 60, the lid member 61, and the like.

Second Embodiment

Figure 9:
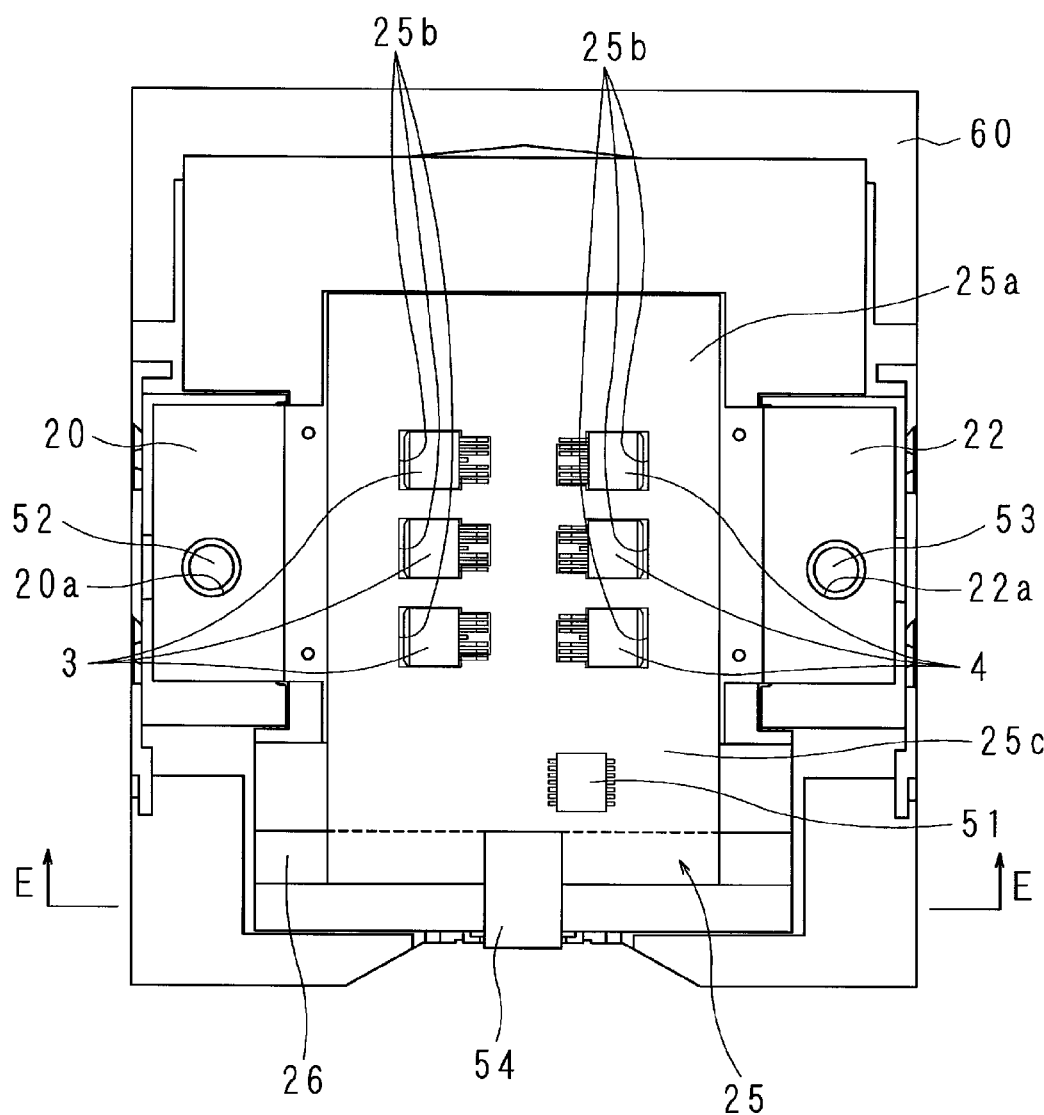
FIG. 9 is a plan view of an electrical junction box in a second embodiment.

FIG. 9 is a plan view of an electrical junction box 1 according to a second embodiment.

The following describes the second embodiment about differences from the first embodiment. Configurations other than the following configurations are the same as those in the first embodiment, and therefore the same configurations as those in the first embodiment are denoted with the same reference signs as those used in the first embodiment, and a description thereof is omitted.

The electrical junction box 1 of the second embodiment differs from the electrical junction box 1 of the first embodiment in the configurations of the reinforcement member 26 and the frame member 60. FIG. 9 corresponds to FIG. 5, and shows the electrical junction box 1 from which the lid member 61 is removed. As shown in FIG. 9, the reinforcement member 26, which has the shape of a rectangular plate, extends from the second extension portion 25c of the circuit board 25 to the inner surface of the left side portion of the frame member 60 and extends from the second extension portion 25c to the inner surface of the right side portion of the frame member 60. A left end face of the reinforcement member 26 abuts against the inner surface of the left side portion of the frame member 60, and a right end face of the reinforcement member 26 abuts against the inner surface of the right side portion of the frame member 60.

Figure 10:
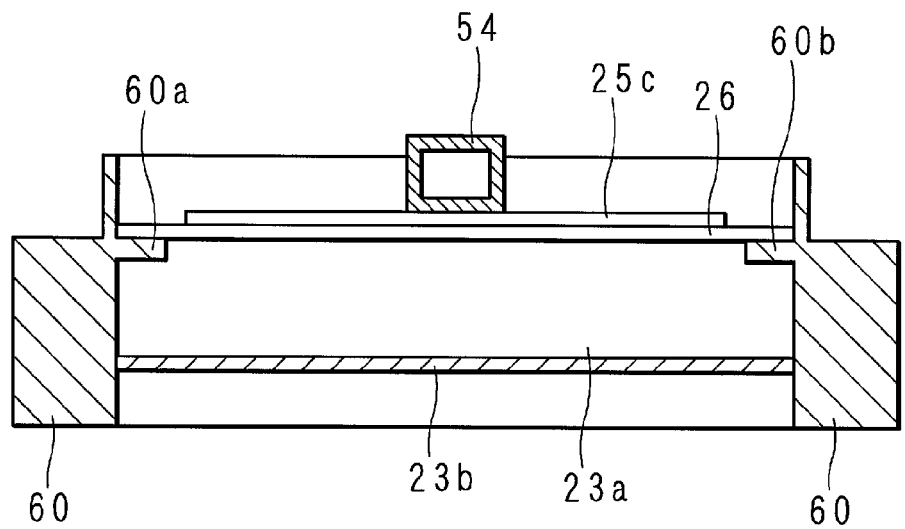
FIG. 10 is a cross-sectional view taken along line E-E in FIG. 9.

FIG. 10 is a cross-sectional view taken along line E-E in FIG. 9. FIG. 10 corresponds to FIG. 8, and schematically shows a cross section taken along line E-E. As shown in FIG. 10, a rectangular projecting plate 60a projects rightward from the inner surface of the left side portion of the frame member 60. Similarly, a rectangular projecting plate 60b projects leftward from the inner surface of the right side portion of the frame member 60. Respective plate surfaces of the projecting plates 60a and 60b face a plate surface of the reinforcement member 26, and respective upper surfaces of the projecting plates 60a and 60b are in contact with a lower surface of the reinforcement member 26. The projecting plates 60a and 60b support the reinforcement member 26. Therefore, the second extension portion 25c of the circuit board 25 has a higher strength.

The electrical junction box 1 of the second embodiment similarly achieves the effects achieved by the electrical junction box 1 of the first embodiment.

It should be noted that the second embodiment is not limited to the configuration in which the reinforcement member 26 is supported by the projecting plates 60a and 60b, and it is only required that the reinforcement member 26 is supported by the frame member 60. Accordingly, for example, a configuration is also possible in which insertion holes are respectively provided in the inner surfaces of the left side portion and the right side portion of the frame member 60, a left end portion of the reinforcement member 26 is inserted into the insertion hole provided in the left side portion of the frame member 60, and a right end portion of the reinforcement member 26 is inserted into the insertion hole provided in the right side portion of the frame member 60.

Third Embodiment

Figure 11:
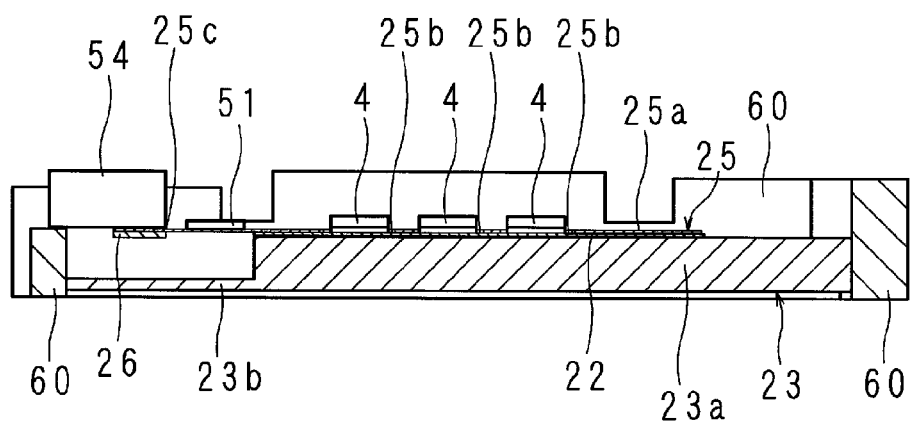
FIG. 11 is a cross-sectional view of an electrical junction box in a third embodiment.

FIG. 11 is a cross-sectional view of an electrical junction box 1 according to a third embodiment.

The following describes the third embodiment about differences from the first embodiment. Configurations other than the following configurations are the same as those in the first embodiment, and therefore the same configurations as those in the first embodiment are denoted with the same reference signs as those used in the first embodiment, and a description thereof is omitted.

The electrical junction box 1 of the third embodiment differs from the electrical junction box 1 of the first embodiment in the shape of the heat dissipation member 23. FIG. 11 corresponds to FIG. 6, and shows a cross section of the electrical junction box 1 from which the lid member 61 is removed. The heat dissipation member 23 in the third embodiment extends in the front-rear direction similarly to that in the first embodiment. As shown in FIG. 11, the first placement portion 23a and the first extension portion 23b of the heat dissipation member 23 each have a rectangular shape similar to those in the first embodiment.

In the heat dissipation member 23, the first placement portion 23a is thicker than the first extension portion 23b in the up-down direction. The first extension portion 23b extends forward from a front end face of the first placement portion 23a. The distance between the upper surface of the first extension portion 23b and the lower surface of the second extension portion 25c is longer than the distance between the upper surface of the first placement portion 23a and the lower surface of the flat plate of the second placement portion 25a, as is the case with the first embodiment. Further, as is the case with the first embodiment, the first extension portion 23b of the heat dissipation member 23 is spaced apart from the second extension portion 25c of the circuit board 25, and there is an air layer between the first extension portion 23b and the second extension portion 25c.

The electrical junction box 1 of the third embodiment similarly achieves the effects achieved by the electrical junction box 1 of the first embodiment.

It should be noted that, in the third embodiment, the reinforcement member 26 may be supported by the frame member 60, as is the case with the second embodiment.

It should be noted that, in the first to third embodiments, a configuration is also possible in which the sources of the three FETs 3 are connected to the conductor 20, the drains of the six FETs 3 and 4 are connected to the conductor 21, and the sources of the three FETs 4 are connected to the conductor 22. In this case as well, current does not flow via the six diodes 3b and 4b so long as the six FETs 3 and 4 are switched OFF.

The number of FETs 3 and the number of FETs 4 are not limited to three, and may be one, two, or four or more. A configuration is also possible in which the number of FETs 3 is not the same as the number of FETs 4. Further, the FETs 3 and the FETs 4 are not limited to the N-channel type. The FETs 3 and the FETs 4 may also be of the P-channel type. However, the type of the FETs 3 is the same as the type of the FETs 4.

The FETs 3 and 4 are only required to function as semiconductor switches, and therefore bipolar transistors, insulated gate bipolar transistors (IGBTs), or the like may be used instead of the FETs 3 and 4. If parasitic diodes are not formed in semiconductor switches, current does not flow via the semiconductor switches when the semiconductor switches are switched OFF. Therefore, if parasitic diodes are not formed in the semiconductor switches, a configuration is also possible that does not include semiconductor switches that are electrically connected between the conductors 21 and 22. In this case, the conductors 21 and 22 are formed as one piece and are treated as one conductor. Further, if there is no possibility that current flows through the conductors 22, 21, and 20 in this order, it is not necessary to provide the FETs 4 in the electrical junction box 1. In this case as well, the conductors 21 and 22 are formed as one piece and are treated as one conductor. If the conductors 21 and 22 are treated as one conductor, the number of conductors is two.

Also, the circuit components connected to the conductors 20, 21, and 22 are not limited to semiconductor switches, and are only required to be components that generate heat. Further, the microcomputer 51 is only required to function as the control element that outputs control signals. Therefore, an element that outputs control signals may be used instead of the microcomputer 51. The number of conductors is not limited to two or three, and may be one, or four or more.

The disclosed first to third embodiments are illustrative examples in all aspects and should not be considered as restrictive. The scope of the present disclosure is defined not by the above descriptions but by the claims, and is intended to encompass all modifications within the meanings and scope that are equivalent to the claims.

The invention claimed is:

1. A circuit device comprising:
a heat dissipation member;
a conductor that is placed on the heat dissipation member with an insulation member interposed therebetween;
a circuit component that is electrically connected to the conductor and generates heat;
a circuit board that is placed on the conductor; and
a control element that is placed on the circuit board and outputs a control signal for controlling operation of the circuit component,
wherein the heat dissipation member includes:
a first placement portion that includes a flat plate on which the conductor is placed and a projecting plate that projects from an edge portion of the flat plate in a direction perpendicular to a plate surface of the flat plate; and
a first extension portion that extends from a plate surface of the projecting plate of the first placement portion,
the circuit board includes:
a second placement portion that is placed on the conductor and is arranged such that the conductor and the insulation member are sandwiched between the first placement portion and the second placement portion; and
a second extension portion that extends from the second placement portion, is located opposite to and is spaced apart from the first extension portion,
the control element is placed on the second extension portion,
the circuit device further includes:
a reinforcement member that is arranged between the first extension portion and the second extension portion, is bonded to the second extension portion, and reinforces the circuit board; and
a connector that is provided on the second extension portion and is electrically connected to the control element,
a distance between the first extension portion and the second extension portion is longer than a distance between the first placement portion and the second placement portion, the control element is located opposite to air with the second extension portion of the circuit board interposed therebetween, and the connector is located opposite to air with the second extension portion of the circuit board and the reinforcement member interposed therebetween.

2. The circuit device according to claim 1, further comprising:
a frame member that is arranged along a circumferential edge of the circuit board, surrounds the circuit board, and supports the reinforcement member.

3. The circuit device according to claim 2, further comprising:
a frame member that is arranged along a circumferential edge of the circuit board and surrounds the circuit board; and
a lid member that is located opposite to the circuit board and covers the inside of the frame member,
wherein the conductor, the circuit component, the circuit board, and the control element are arranged between the heat dissipation member and the lid member.

4. The circuit device according to claim 2,
wherein the circuit device includes a plurality of the conductors,
the circuit component is a semiconductor switch that is electrically connected to two of the plurality of conductors, and
the control signal is a signal for turning the circuit component ON or OFF.

5. The circuit device according to claim 2, wherein the heat dissipation member is obtained by bending a metal plate.

6. The circuit device according to claim 1, further comprising:
a frame member that is arranged along a circumferential edge of the circuit board and surrounds the circuit board; and
a lid member that is located opposite to the circuit board and covers the inside of the frame member,
wherein the conductor, the circuit component, the circuit board, and the control element are arranged between the heat dissipation member and the lid member.

7. The circuit device according to claim 6,
wherein the circuit device includes a plurality of the conductors,
the circuit component is a semiconductor switch that is electrically connected to two of the plurality of conductors, and the control signal is a signal for turning the circuit component ON or OFF.

8. The circuit device according to claim 6, wherein the heat dissipation member is obtained by bending a metal plate.

9. The circuit device according to claim 1, wherein the circuit device includes a plurality of the conductors, the circuit component is a semiconductor switch that is electrically connected to two of the plurality of conductors, and the control signal is a signal for turning the circuit component ON or OFF.

10. The circuit device according to claim 9, wherein the heat dissipation member is obtained by bending a metal plate.

11. The circuit device according to claim 1, wherein the heat dissipation member is obtained by bending a metal plate.

* * * * *